United States Patent [19]

Takahashi et al.

[11] Patent Number: 4,851,882
[45] Date of Patent: Jul. 25, 1989

[54] ILLUMINATION OPTICAL SYSTEM

[75] Inventors: Kazuhiro Takahashi, Kawasaki; Akiyoshi Suzuki, Tokyo, both of Japan

[73] Assignee: Canon Kabushiki Kaisha, Tokyo, Japan

[21] Appl. No.: 267,718

[22] Filed: Nov. 4, 1988

Related U.S. Application Data

[63] Continuation of Ser. No. 196,863, May 23, 1988, abandoned, which is a continuation of Ser. No. 936,748, Dec. 2, 1986, abandoned.

[30] Foreign Application Priority Data

Dec. 6, 1985 [JP] Japan .................................. 60-275689
Jul. 2, 1986 [JP] Japan .................................. 61-155826

[51] Int. Cl.$^4$ ............................................. G03B 27/44
[52] U.S. Cl. ....................................... 355/46; 355/67; 362/311
[58] Field of Search .............. 355/46, 56, 67, 71, 355/75; 350/523, 572, 573, 479, 423, 167; 362/311, 368

[56] References Cited

U.S. PATENT DOCUMENTS

| 1,783,998 | 12/1930 | Chretien | 350/572 X |
| 3,649,113 | 3/1972 | Harvey | 355/56 X |
| 3,876,289 | 4/1975 | DeVeer et al. | 350/523 X |
| 4,444,471 | 4/1984 | Ford, Jr. et al. | 350/423 |
| 4,497,015 | 1/1985 | Konno et al. | 355/67 X |
| 4,564,267 | 1/1986 | Nishimoto | 350/379 |
| 4,619,508 | 10/1986 | Shibuya et al. | 355/67 X |
| 4,645,924 | 2/1987 | Suzuki et al. | 250/236 |

FOREIGN PATENT DOCUMENTS 60-114805 6/1985 Japan .
61-267722 11/1986 Japan .

Primary Examiner—L. T. Hix
Assistant Examiner—Brian W. Brown
Attorney, Agent, or Firm—Fitzpatrick, Cella, Harper & Scinto

[57] ABSTRACT

An illumination optical system including an optical system effective to direct light from a light source to a surface to be illuminated, and an optical unit disposed in a path of the light defined by the optical system, the optical unit having a variable refracting power which is variable in accordance with the size of the surface to be illuminated.

34 Claims, 8 Drawing Sheets

ILLUMINATION OPTICAL SYSTEM

This application is a continuation, of application Ser. No. 196,863 filed May 23, 1988, which was a continuation of application Ser. No. 936,748 filed Dec. 2, 1986, both now abandoned.

FIELD OF THE INVENTION AND RELATED ART

This invention relates to an illumination optical system and, more particularly, to an illumination optical system suitably usable in a fine circuit device manufacturing apparatus for manufacturing semiconductor devices, liquid crystal panel display device, etc., for efficiently illuminating a surface of a photomask or reticle having a fine pattern or patterns such as microcircuit patterns.

In the field of manufacture of semiconductor devices such as integrated circuits or electronic circuits, the recent trend to produce higher capacity circuit devices has required the reproduction of higher density circuit patterns. In this respect, advancement in photolithographic technology is desired in order to assure the formation of fine or high density circuit patterns.

While various types of photolithographic exposure apparatuses have been developed, reduction projection type exposure apparatuses are currently most attractive because higher resolving power is attainable with them. In this type of exposure apparatus, a projection optical system is employed to project an image of a pattern of the reticle, the pattern having a size which is m-times larger than the size of a pattern that is to be produced, onto a wafer in a reduced scale, i.e. at a ratio of 1/m.

In the reduction projection type exposure apparatuses, the projection optical system has an effective field of image projection which field is narrower than the wafer surface. Therefore, each time one exposure (projection exposure) is completed, a wafer stage carrying the wafer thereon is moved by a predetermined amount to thereby allow exposure of the next shot area on the wafer. This is called "step-and-repeat exposure".

Usually, the reticle on which a circuit pattern or patterns are formed is quadrangular. Also, the area on the wafer which is to be exposed to the reticle pattern by one exposure is quadrangular having each side of a length in a range of few millimeters to ten or more millimeters. In this area, a circuit pattern or patterns corresponding to one or more chips are to be reproduced.

On the other hand, illumination optical systems of the reduction projection type exposure apparatuses, which are provided to illuminate the surface of the reticle, have an effective field of illumination of circular shape. At the time of projection exposure of the wafer, the effective field of illumination of the illumination optical system is partially intercepted by a masking mechanism to thereby define an illumination light having a quadrangular sectional shape, similar to the shape of the reticle.

Where the reticle surface is illuminated by using light having a quadrangular sectional shape whidh is defined by the masking mechanism and which is inscribed in a circle of the effective illumination field of the illumination optical system, it can be said that the light from the light source is utilized most efficiently. However, the range of illumination desired is variable depending on the user's desires. If the desired illumination range is smaller than the effective field of illumination of the illumination optical system, the quantity of light not used for the illumination increases with the result that the illumination efficiency decreases.

Depending on the size of the wafer used, a similar problem will be involved in the case of the manufacture of semiconductor devices by use of contact type photolithographic exposure apparatuses wherein a mask having a circuit pattern and a wafer are brought into intimate contact with each other, or of proximity type photolithographic exposure apparatuses, wherein the mask and the wafer are spaced from each other by a predetermined gap.

SUMMARY OF THE INVENTION

Known type illumination optical systems employed in conventional fine circuit device manufacturing exposure apparatuses have fixed effective fields of illumination. This is inconvenience because any change in the size of the area to be illuminated will lead to substantial loss of the quantity of light in the plane of the area being illuminated. It is accordingly a primary object of the present invention to provide an illumination optical system having a variable effective field of illumination, by which light from a light source can always be utilized efficiently.

It is another object of the present invention to provide an illumination optical system wherein an effective field of illumination thereof can be controlled as desired and with a very simple arrangement.

To achieve these objects, in accordance with one aspect of the present invention, there is provided an illumination optical system which includes an optical system for directing light from a light source to a surface to be illuminated, and optical means disposed in a path of the illuminating light defined by the optical system and having a refracting power which is variable so as to change the sectional area of the illuminating light in accordance with the size of the surface to be illuminated.

In one preferred form of the present invention, the optical means comprises a lens system including one or more single lenses or compound-eye lenses. In another preferred form, it comprises an optical device including an electrooptic crystal element, a liquid crystal element, a transparent elastomeric element, etc.

In the former case, the optical means is preferably composed of a plurality of movable lens groups, wherein one or more lens groups are moved in the direction of an optical axis such that a variable focal length lens system is provided. By this, the refracting power of the lens system is changed to thereby change the sectional area of the illuminating light which passes the lens system.

In the latter case using the optical device the refractive index and/or the shape of the refracting surface of such optical device is changeable by controlling an electric field to be applied thereto or by means of a piezoelectric type actuator, etc. By changing the refractive index and/or the shape of the refracting surface, the refracting power of the optical device is changed to thereby change the sectional area of the illuminating light which passes the optical device.

The above-described optical device and the lens system comprising single or compound-eye lenses may be used in combination to provide the optical means.

The optical device and/or the lens system comprising single or compound-eye lens components are disposed at a desired location along the path of light, and these optical means may be considered as one component of the illumination optical system.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 3A and 3B are schematic views, respectively, showing the relation between an effective field of illumination and an area to be illuminated, wherein FIG. 3A shows the state prior to the adjustment of the refracting power and FIG. 3B shows the state after the adjustment of the refracting power in accordance with the present invention.

DESCRIPTION OF THE PREFERRED EMBODIMENTS

Figure 1:
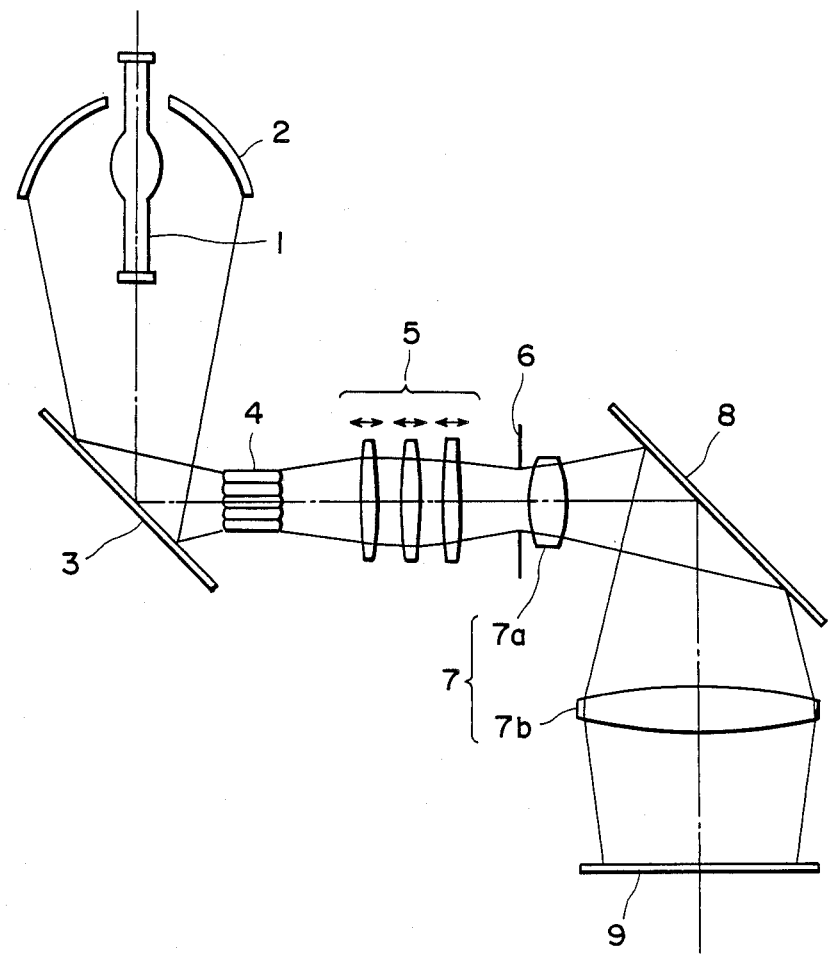
FIG. 1 is a schematic view of an illumination optical system according to one embodiment of the present invention.

Referring first to FIG. 1, there is shown an illumination optical system according to one embodiment of the present invention, which is incorporated into a semiconductor device manufacturing exposure apparatus. Denoted in this Figure by numeral 1 is a light source which comprises, in this example, a Hg lamp; by 2, an elliptical mirror; by 3, a reflecting mirror; by 4, an optical integrator; by 5, a condenser lens system comprising a plurality of lens groups each being movable in the direction of an optical axis; by 6, a field stop; by 7, a condensing lens system comprising lens elements 7a and 7b; by 8, a second reflecting mirror; and by 9, a reticle having a circuit pattern formed thereon. The light emitted from the lamp 1 is concentrated by the elliptical mirror 2 on the optical integrator 4 having a light-receiving surface which is located at a second focal point of the elliptical mirror 2. At this time, as shown in FIG. 1, the mirror 3 is arranged to deflect, by 90 degrees the optical axis of an illumination system comprising the lamp 1 and the elliptical mirror 2.

As will be described with reference to another embodiment of the present invention, the optical integrator 4 is provided to uniformly illuminate the surface, to be illuminated, and comprises a fly's-eye lens system or the like. A bundle of optical fibers may be used as the optical integrator 4. Any other arrangement may of course be used. What is important is that the integrator 4 includes a plurality of elements which are arranged such that the light beams emerging from these elements are superposed upon one another, i.e. integrated, in the plane of the surface being illuminated.

The mirror 3 is of a total reflection type and is usually called a "cold mirror". The mirror 3 is provided to intercept longer wavelengths of the light from the lamp 1 including different wavelengths.

The light convergently incident on the optical integrator 4 is propagated by the elements of the integrator 4 and emerges from a light-emitting surface of the integrator 4. Thus, a plurality of light-emitting points are defined on the light-emitting surface of the optical integrator 4. That is, the optical integrator 4 defines secondary light source means and functions as multi-beam producing means. The light from the optical integrator 4 which is the secondary light source means passes through the condenser lens system 5 and illuminates a plane in which the field stop 6 is disposed. As described in the introductory part of the Specification, the field stop 6 has the function of adjusting, as desired, the range of illumination on the reticle 9 surface. That is, the stop 6 is a variable aperture stop which is called a "masking blade assembly".

The field stop 6 is adapted to change its light-transmitting aperture in accordance with the size of the chip, to thereby controllably confine the light passing therethrough. That is, the light for illuminating the reticle 9 is controlled so as to have a desired size and a desired sectional shape (usually quadrangular) after passing the field stop 6. The light passing through the field stop 6 enters the lens component 7a of the condensing lens system 7, which lens component is disposed adjacent to the field stop 6. After passing the lens component 7a, the light is incident on the second reflecting mirror 8 by which the direction of advancement of the light is deflected by 90 degrees, such that the light is projected by the lens component 7b onto the reticle 9. By this means, the circuit pattern of the reticle 9 having a predetermined size or area is illuminated.

The illumination optical system shown in FIG. 1 is arranged such that, where the optical system, which is composed of the lens systems 5 and 7, has a focal distance F, the light-emitting surface of the optical integrator 4 is located at a front focal point position of this optical system while the reticle 9 surface, i.e. the surface to be illuminated, is located at a rear focal point position of this optical system That is, the illumination optical system of the FIG. 1 embodiment has an "F-F arrangement". With this structure, the light beams emerging from the elements of the optical integrator 4 are efficiently superimposed upon one another, in the plane of the reticle 9 surface.

Where the exposure apparatus is arranged such that a projection optical system (not shown in FIG. 1) which is disposed between the reticle 9 and a wafer (not shown) has an entrance pupil located at a position optically conjugate with the light-emitting surface of the optical integrator 4, the illumination optical system is effective to define Kohler illumination for the wafer. Accordingly, more uniform and stable illumination is attainable.

It will be readily understood that FIG. 1 shows major components, only, which pertain to the illumination of the reticle 9. Actually, the illumination optical system of the present embodiment includes additional mechanisms such as a shutter mechanism for selectively blocking the light from the light source monitoring means for detecting the quantity of light for illumination, and the like. If desired, filter means for selecting light of a desired wavelength or wavelengths may be employed.

When, in the above-described illumination optical system, it is desired to reduce the range of illumination on the reticle 9 surface in accordance with the reduction in size of the chip, the aperture of the field stop 6 is adjusted to reduce the sectional area of the substantial illuminating light. Where the effective field of illumination is fixed as in the prior art, the degree of shading of the light by the field stop 6 increases with the reduction in size of the aperture of the field stop 6, with the result that efficient utilization of the light is not attainable. In view of this, according to this embodiment of the present invention, the condenser lens system 5 is composed of plural lens groups each being movable in the direction of the optical axis of the illumination optical system. That is, by adjustingly moving one or more of these lens groups as denoted by arrows in FIG. 1, the refracting power of the condenser lens system 5 is changed to thereby change the effective field of illumination at the plane of the field stop 6. Most desirably, the positions of the lens groups of the condenser lens system 5 are controlled such that the aperture of the field stop 6, which is quadrangular, is substantially inscribed in the circle of the effective field of illumination defined by the condenser lens system 5. If this is done, the degree of shading of the light by the field stop 6 can always be maintained at a minimum, regardless of the size of the illumination range on the reticle 9 desired.

Details of the condenser lens system 5 which assures establishment of the effective field of illumination as desired, will now be described taken in conjunction with FIGS. 2A and 2B.

Figure 2A:
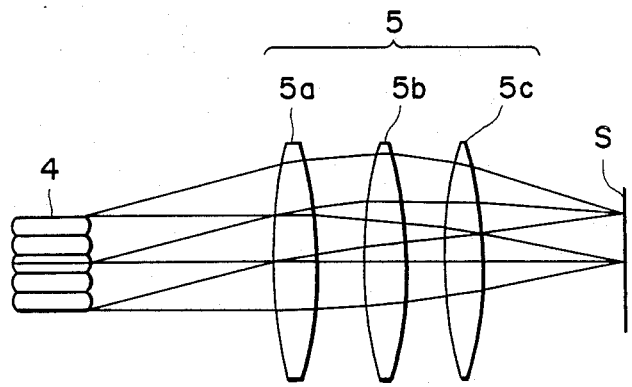
FIGS. 2A and 2B are schematic views, respectively, illustrating the function of a variable power condenser lens system of the FIG. 1 embodiment.
Figure 2B:
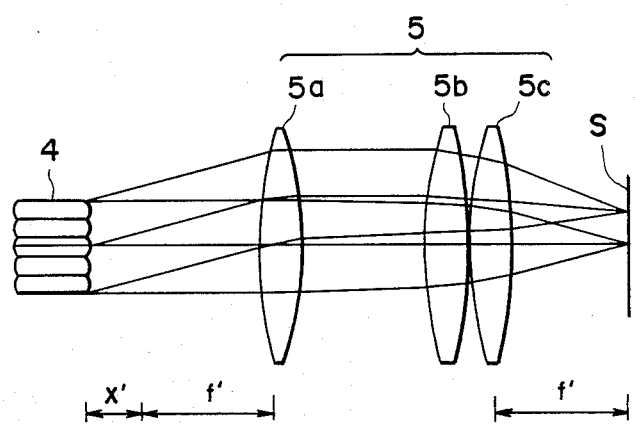

FIGS. 2A and 2B are schematic views prepared for explicating the function of the condenser lens system 5 shown in FIG. 1. Denoted in these Figures by 5a, 5b and 5c are the lens groups which, in combination, constitute the condenser lens system 5. Each of the lens groups 5a–5c is composed of one or more lens components. Denoted in FIG. 2A by "f" is the focal distance of the condenser lens system 5 which is in a first state shown in FIG. 2A. Also, denoted in this Figure by "x" is the distance from the light emitting surface of the optical integrator 4 which is the secondary light source means to the focal point position, at the object side, of the condenser lens system 5 which is in the first state. On the other hand, denoted by "f'" and "x'" in FIG. 2B are the focal distance of the condenser lens system 5 which is in a second state shown in FIG. 2B and the distance from the light-emitting surface of the optical integrator 4 to the focal point position, at the object side, of the condenser lens system 5 which is in the second state, respectively. As shown in these Figures, the condenser lens system 5 is composed of three lens groups 5a–5c each of which is mechanically movable by suitable driving means in the direction of the optical axis. Also, at a position spaced from a rear principal plane of the condenser lens system 5 by a distance corresponding to the focal distance f (or f') of the condenser lens system 5, the surface to be illuminated, denoted at S, such as the surface of the reticle 9 shown in FIG. 1 is disposed. When the lens groups 5a –5c, which are in the first state shown in FIG. 2A are displaced so as to change the focal distance (power) of the condenser lens system 5, in order to change the effective field of illumination at the surface S (i.e. the sectional area of the illuminating light), the optical conditions of the condenser lens system 5 are changed from the first state shown in FIG. 2A to the second state shown in FIG. 2B. In the present embodiment, at this time, the following condition is set so as to efficiently change the effective field of illumination with the change in the refracting power. The condition is that: the distance from the rear principal plane of the condenser lens system 5 to the surface to be illuminated is always maintained substantially equal to the focal distance of the condenser lens system 5, whatever focal distance is established by the control of the refracting power. In the state of FIG. 2B, the distance from the rear principal plane of the condenser lens system 5 to the surface S is equal to the focal distance f'.

Further, in the step-and-repeat projection type exposure apparatuses as in the case of the present embodiment, it is desirable that the positional relation between the secondary light source means provided by the optical integrator 4 and the condenser lens system 5 satisfies the following condition:

$$x/f^2 = constant$$

That is, the relation "$x/f^2 = x'/f'^2$" is satisfied in the first and second states of FIGS. 2A and 2B. By satisfying this relation, an image of the secondary light source means provided by the optical integrator 4 can always be formed at a fixed position which is in this example the pupil plane of the projection lens system (not shown) for projecting the circuit pattern of the reticle 9 onto the wafer (not shown). Accordingly, the position of the effective light source with respect to the pupil plane of the projection lens system can be maintained fixed. In order to satisfy the above-described condition, it is necessary that the condensing optical system is composed of at least three lenses or lens groups, as shown in FIGS. 2A and 2B.

The illumination optical system described above may be arranged such that an image of the light-emitting surface of the optical integrator 4 (i.e. an image of the secondary light source means) is formed at the middle of the path of the illuminating light, at a desired magnification, and that the light having formed the image is directed to the reticle 9.

The lens system 5 is illustrated schematically in FIGS. 2A and 2B, and it will be readily understood that the lens system 5 of FIGS. 2A and 2B is optically equivalent to a combination of the condenser lens system 5 and the lens system 7 shown in FIG. 1. That is, the focal distance f or f' described with reference to FIGS. 2A or 2B corresponds to the focal distance of the combined condenser lens system 5 and lens system 7.

Also, it will be understood from the foregoing that the arrangement of the variable-power optical system for directing the light from the optical integrator 4 to the surface S with variable size or sectional area, is not limited to that shown in FIGS. 1 or 2.

Furthermore, while the illumination optical system described with reference to FIGS. 1–2B is of the type having an optical integrator such as at 4 which comprises fly's-eye lens, the concept of the present invention is, of course, applicable to an illumination optical system not having such optical integrator.

Figures 3A, 3B:
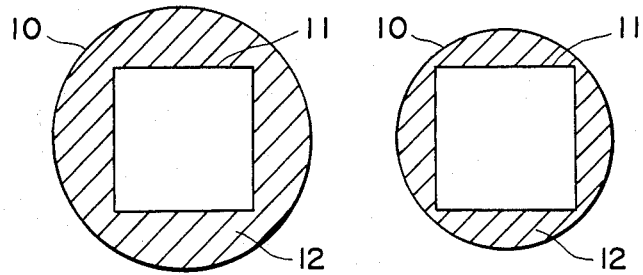

FIGS. 3A and 3B are schematic views, respectively, showing the relation between the effective field of illumination and the size of the range of illumination desired. FIG. 3A shows the state in which the sectional area of the illuminating light is not yet controlled with reference to a predetermined or desired range of illumination, the state corresponding to that shown in FIG. 2A. On the other hand, FIG. 3B shows the state in which the sectional area of the illuminating light has been controlled with reference to the same range of illumination by means of the condenser lens system 5, the state corresponding to that shown in FIG. 2B. Denoted in FIGS. 3A and 3B by numeral 10 is the effective field of illumination; and by 11, the range of illumination desired (i.e. the area to be illuminated). The hatched portion denoted at 12 depicts the loss of light quantity. From these Figures, it is seen that use of the optical means (comprising the condenser lens system 5) for changing the effective illumination field is effective to suppress the loss of light quantity (at 12) to a minimum. This leads to an increase of the illuminance at the surface being illuminated. If, for example, the size of the area on the wafer to be illuminated by one exposure is reduced by 10% per one side, use of the present invention allows an increase in the illuminance by approximately 23% As a result, the throughput of the semiconductor device manufacturing exposure apparatus can be improved significantly.

Although in the foregoing embodiment, a variable-power condenser lens system composed of at least three lens groups has been described as the optical means for changing the sectional area of the illuminating light, such optical means is not limited to one utilizing the principle of geometrical optics described above. For example, electrooptic means such as described in U.S. Pat. No. 4,564,267 or magnetooptic means may be used to change the sectional area of the illuminating light, provided that it meets specifications of the illumination optical system and has the desired optical performance. Further, an elastomeric optical element such as described in U.S. Pat. No. 4,444,471 or Japanese Laid-Open Patent Application, Laid-Open No. 114805/1985 may be used as the above-described optical means. The elastomeric optical element comprises a lens system formed of a transparent elastomeric material. By changing the curvature of such a lens element by use of a suitable actuator or other means, the power (refracting power) thereof can be changed. Where the special optical means or element of the type described above is to be employed, it may be used in combination with one or more ordinary lens systems or, alternatively, a plurality of such special optical means or elements may be used, to correct aberrations or to satisfy an imaging relation in the illumination optical system.

While, in the foregoing embodiment, the effective field of illumination of the illuminating light has a circular shape, the illumination optical system may be arranged to define an effective field of illumination of elliptical shape or rectangular shape This is easily attainable by, for example, use of cylindrical lens means. Particularly in view of the quadrangular shape of the surface to be illuminated, in the case of photoprinting of the semiconductor wafer by projection exposure, use of the effective field of illumination having an elliptical or rectangular shape is very effective because it assures further reduction of the loss of light quantity.

When the illumination optical system of the present invention is incorporated into a semiconductor device manufacturing exposure apparatus, as in the case of the FIG. 1 embodiment, the control of the sectional area of the illuminating light is performed in the following manner:

As will be described in more detail with reference to FIG. 8, the data concerning the layout of shots (shot areas) on the wafer corresponding to the size of each chip, is inputted into the apparatus from an input device such as, for example, a console which is operationally associated with a control unit. The control unit processes the data to calculate the effective field of illumination, on the basis of the shot layout. From the results of this calculation about the effective field of illumination, the data concerning, e.g., the amount of movement to be made by one or more lens groups of the condenser lens system 5, is calculated. In accordance with the results of this calculation, a suitable driving mechanism is actuated to move the one or more lens groups of the condenser lens system 5 to their desired positions, to thereby change the refracting power of the lens system 5. Where the illumination optical system is provided with a variable-aperture field stop such as at 6 in FIG. 1, the shape and the size of the aperture of the field stop is controlled in parallel to the control of the refracting power of the condenser lens system 5.

Figure 4:
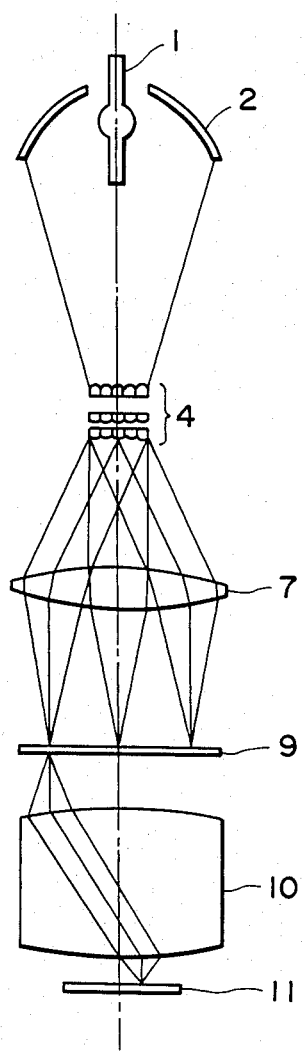
FIG. 4 is a schematic view of an illumination optical system according to another embodiment of the present invention.

Referring now to FIG. 4, an illumination optical system according to another embodiment of the present invention will be described.

While the illumination optical system of the FIG. 1 embodiment employs a variable-power condenser lens system which is composed of a plurality of single-lens components, the illumination optical system of the present embodiment includes a variable-power optical system comprising compound-eye lens means.

The illumination optical system of the present embodiment is incorporated into a semiconductor device manufacturing exposure apparatus of reduction projection type. The apparatus includes a light source 1 which comprises, e.g., a Hg lamp or a halogen lamp. An elliptical mirror 2 has a first focal point at which a light-emitting surface of the light source 1 is disposed so that the light from the source 1 is efficiently concentrated by the elliptical mirror 2. That is, the light from the source 1 is concentrated at or in the vicinity of a second focal point of the elliptical mirror 2. Denoted by numeral 4 is an optical integrator which comprises a plurality of minute lens elements and defines secondary light source means having uniform light-distribution characteristics. The optical integrator 4 is disposed in the neighborhood of the second focal point of the elliptical mirror 2. A condenser lens system 7 is provided to concentrate beams of light from the optical integrator 4. More particularly, the condenser lens system 7 is so disposed that the optical integrator 4 which is the secondary light source means is located in the vicinity of a front focal point of the condenser lens system 7. Thus, the condenser lens system 7 is effective to converge each of the beams of light from the optical integrator 4 to uniformly illuminate the surface of a reticle 9, which is the surface to be illuminated, such as shown in FIG. 4. The reticle 9 is disposed at or in the vicinity of a rear focal point of the condenser lens system 7, such that the beams of light from the optical integrator 4 are superimposed upon one another in good order in the plane of the reticle 9. A projection optical system 10 is provided to project an image of a pattern of the reticle 9 onto the surface of a wafer 11 on a reduced scale.

Where the exposure apparatus is of the contact type or the proximity type, the projection optical system 10 is not necessary and the wafer 11 and the reticle (mask) 9 which is the surface to be illuminated, are maintained in intimate contact or are spaced from each other with a predetermined gap.

The range of illumination on the reticle 9 in this embodiment has a quadrangular shape and, on the other hand, the effective field of illumination by the light from the condenser lens system of the illumination optical system has a circular shape. In view of this, it is desired to assure that the range of illumination on the reticle 9 as denoted at 11 in FIGS. 3A and 3B is substantially inscribed in the circle of the effective field of illumination of the illumination optical system as denoted at 10, such as illustrated in FIG. 3B. By doing so, the light from the light source can be most efficiently utilized.

To achieve this, in the present embodiment, the optical integrator 4 is provided with a variable-power optical system. That is, the angle of emission of the light from the optical integrator 4 is made variable so as to assure that the range of illumination on the reticle 9 surface is always substantially inscribed in the circle of the effective field of illumination by the illumination optical system. By doing so, the quantity of light not used for the illumination is reduced, with the result that the illumination efficiency is improved.

Details of the optical integrator 4 of the present embodiment will now be described, taken in conjunction with FIGS. 5A-5C, 6A-6C and 7.

Figure 5A:
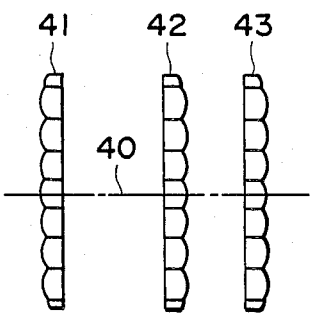
FIG. 5A is an enlarged side view schematically showing an optical integrator used in the FIG. 4 embodiment.
Figure 5B:
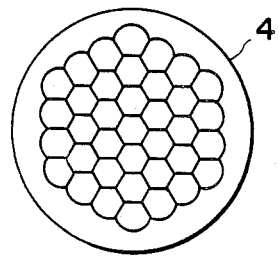
FIG. 5B is a front end view of the optical integrator of FIG. 5A.

FIG. 5A is an enlarged view of the optical integrator 4 shown in FIG. 4. Denoted by numeral 40 is the optical axis of the illumination optical system; and by 41, 42 and 43, minute-lens groups, each comprising a plurality of minute lens elements. FIG. 5B is a front end view of one of the minute-lens groups shown in FIG. 5A. As will be seen from FIGS. 5A and 5B, each of the minute lens elements is made by a hexagonal-columnar glass body having one of or both of its ends formed into convex surface shape.

Figure 5C:
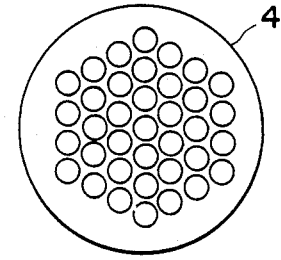
FIG. 5C is a front end view of a modified form of the optical integrator.

Each of the minute-lens groups may be formed by glass molding for forming, on one surface or both surfaces of a flat glass plate, a plurality of minute convexities. Alternatively, minute lens elements may be separately provided in a common barrel, such as shown in FIG. 5C.

Figure 6A:
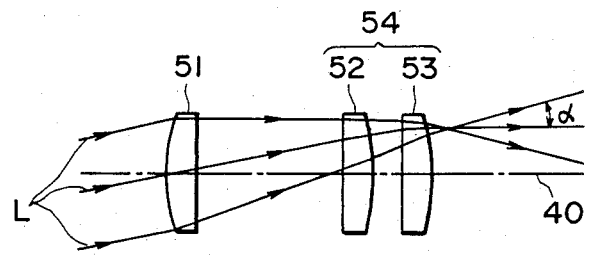
FIGS. 6A-6C are schematic views explicating the manner of changing the refracting power of the optical integrator of the FIG. 4 embodiment.
Figure 6B:
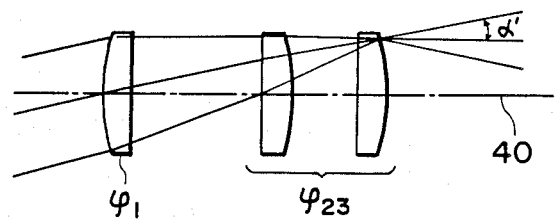
Figure 6C:
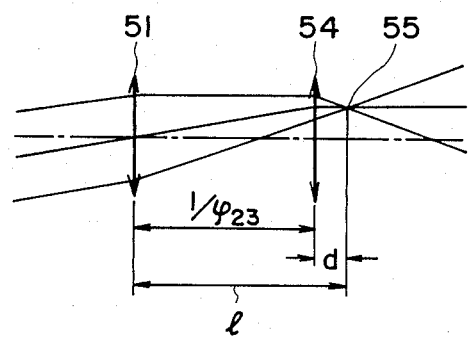

FIGS. 6A-6C are schematic views, respectively, for explicating the function of three minute lens elements of the three minute-lens groups constituting the optical integrator 4. In this example, such three minute lens elements that are on the optical axis 40 (FIG. 5A) of the illumination optical system, are selected for explanation. Denoted in FIGS. 6A-6C by numerals 51, 52 and 53 are the selected minute lens elements of the minute-lens groups 41–43, respectively. Also, denoted by character L is the illuminating light.

Where the refracting power of the lens element 51 is $\phi_1$ and the combined refracting power of the lens elements 52 and 53 is $\phi_{23}$, then the maximum angle of emission $\alpha$ of the light from the lens element 53 is proportional to the refracting power $\phi_{23}$.

For this reason, by changing the refracting power $\phi_{23}$, the maximum emission angle $\alpha$ can be changed as desired, such as is depicted at $\alpha'$ in FIG. 6B. The power (refracting power) arrangement at this time is illustrated in FIG. 6C. The distance d from the position of the secondary light source 55 to a rear principal point of the combined lens elements 54 (52 and 53) of the optical integrator is expressed as follows:

$$d = 1/\phi_2(1 - \phi_1/\phi_{23})$$

Also, the length l from the principal point of the lens element 51 to the secondary light source 55 is given by the following equation:

$$l = 1/\phi_{23}(2 - \phi_1/\phi_{23})$$

In the present embodiment, the illumination optical system is arranged so that the position of the secondary light source is maintained fixed irrespective of the change in the refracting power. For example, the optical integrator as a whole is displaced in the direction of the optical axis in order that the position at which an image of the secondary light source is formed does not deviate from the position of the pupil of the projection lens system.

In the illumination optical system of the present embodiment, and upon changing the refracting power of the optical integrator 4, chief rays of the beams of light emitted from the optical integrator 4 are always maintained substantially in parallel to the optical axis of the illumination optical system whatever refracting power is chosen. That is, beams of light having chief rays which advance substantially in parallel to the optical axis of the illumination optical system are projected onto the reticle 9 surface. By doing so, illumination ranges defined by the beams of light from different portions of the light-emitting surface of the optical integrator are superimposed upon one another in good order in the plane of the reticle 9. This assures efficient illumination and, in addition thereto, uniform illumination of the reticle surface. This can be expressed in another way. That is, for different refracting powers, the interval between the principal points of the lens element 51 and the combined lens elements 54 is maintained to be equal to "$1/\phi_{23}$", i.e to be equal to the focal distance of the combined lens elements 54. As a result, uniform illumination of the reticle is assured.

Figure 7:
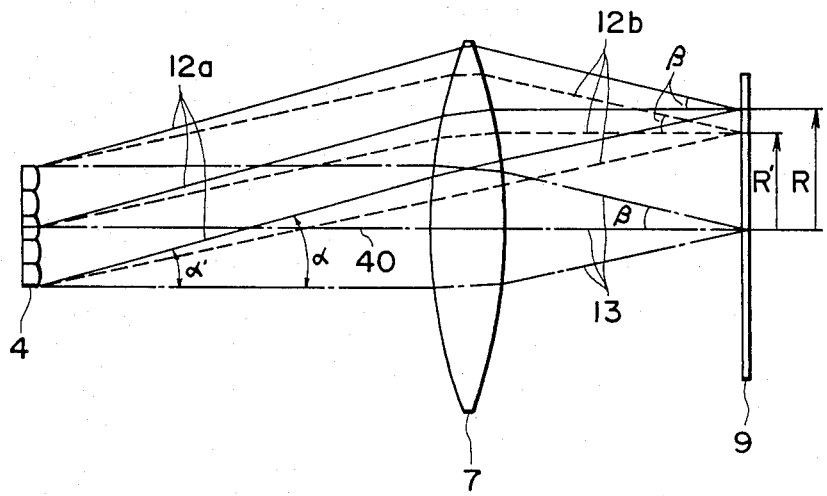
FIG. 7 is a schematic view illustrating the relation between the light from the optical integrator and the effective of illumination.

FIG. 7 is a schematic view explicating the effective field of illumination to the reticle 9 surface, with reference to two kinds of emission angles $\alpha$ and $\alpha'$ of the lights from the optical integrator 4. For the emission angles $\alpha$ and $\alpha'$, two different effective fields of illumination are defined on the reticle 9 that have radii R and R', respectively. From the drawing, it will be readily understood that this relation is satisfied:

$$\alpha'/\alpha = R'/R$$

The present embodiment utilizes this relation to change the interval between the two minute-lens groups 42 and 43 to thereby change the refracting power of the optical integrator and thereby change the angle of emission of light from the optical integrator, such as is depicted at $\alpha$ and $\alpha'$. In this manner, the range of illumination on the reticle 9 is controlled as desired.

In this case, the angle $\beta$ of incidence of the light upon the reticle 9 surface is an amount or factor which affects the resolving power of the pattern projection. However, the angle $\beta$ is unchangeable with the change in the refracting power of the optical integrator. This is also the case with the contact type exposure or the proximity type exposure.

In accordance with this embodiment of the present invention, as described hereinbefore, the effective field of illumination is controlled in the manner described, such that the desired illumination range 11 (FIG. 3B) on the reticle 9 is substantially inscribed in the circle of the effective field of illumination, regardless of reduction in size of the range 11. As a result, efficient illumination is always ensured.

When, for example, each side of the range 11 is reduced by 10% and the effective field of illumination is changed accordingly by changing the refracting power, the illuminance can be increased by approximately 23%.

Also, in the case of contact type exposure or the proximity type exposure, when the range of illumination is changed from 6 inches (diameter) to 5 inches, the illuminance can be increased by approximately 44%.

In the present embodiment, as described, the optical integrator 4 is composed of three minute-lens groups, two of which are displaced along the optical axis, while the integrator as a whole is displaced along the optical axis, to thereby change the effective field of illumination. However, the concept of the present invention is not limited thereto. That is, the integrator 4 may be composed of four or more minute-lens groups. In such case, the refracting power may be changed by changing the interval between at least two lens groups.

Figure 8:
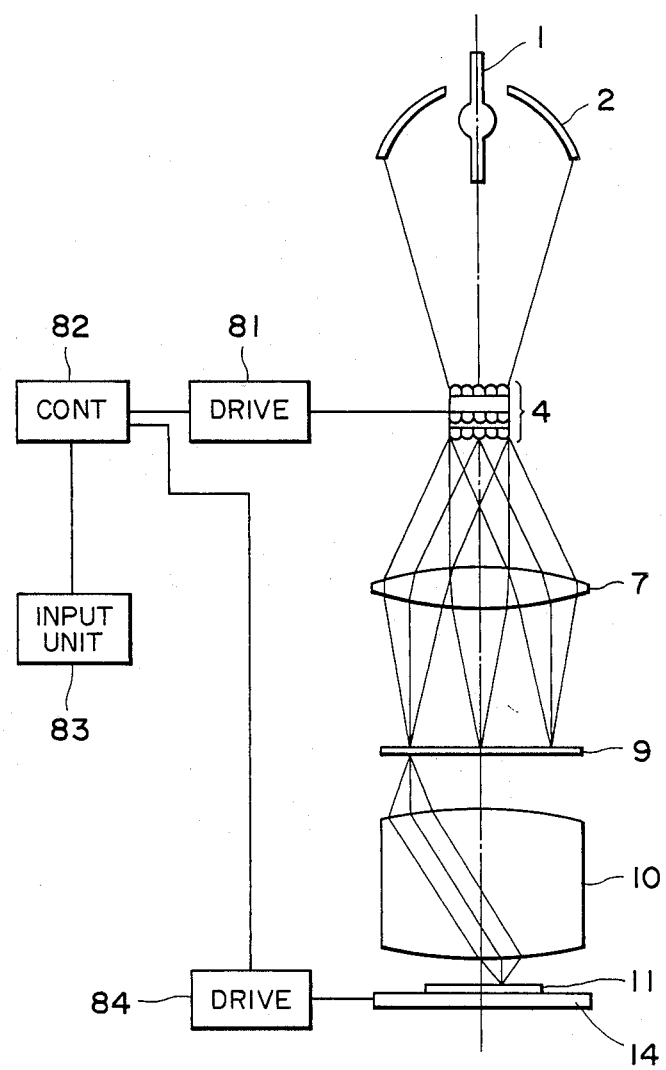
FIG. 8 is a schematic and diagrammatic view of a projection type exposure apparatus into which the illumination optical system shown in FIG. 4 is incorporated.

Referring now to FIG. 8, there is schematically and diagrammatically illustrated a semiconductor device manufacturing exposure apparatus of reduction projection type, into which an illumination optical system according to the present invention is incorporated. More particularly, the illumination optical system incorporated is of the type described with reference to FIG. 4. Thus, same reference numerals are assigned to elements having similar or corresponding functions as of those in the FIG. 4 embodiment.

Denoted in FIG. 8 by numeral 14 is an X-Y stage on which a wafer 11 is carried; by 81, a driving unit for moving, as desired, the lens groups of the optical integrator 4 of variable-power type; by 82, a control unit for controlling various operations to be performed in the exposure apparatus; by 83, an input unit which is used to input, into the apparatus, various data such as those concerning the shot layout, the input unit including a display, a keyboard, etc.; and by 84, a driving unit for driving the X-Y stage in two-dimensional directions. Since the illumination optical system of the present embodiment has the same structure as that having been described with reference to FIG. 4, description thereof will be omitted here for the sake of simplicity.

In FIG. 8, the circuit pattern of the reticle 9 as irradiated with light from the illumination optical system, is projected onto the wafer 11 by the projection optical system 10 on a reduced scale. The range of illumination on the wafer 11 surface per one exposure usually covers one to several chips. Therefore, to perform exposures to the entire surface of the wafer 11, the X-Y stage 14 carrying the wafer 11 is moved by the driving unit 84 and, during such movement, exposures are made to different shots (shot areas). That is, images of the pattern of the reticle 9 are photoprinted by projection exposure on the shot areas of the wafer, in the step-and-repeat manner.

The driving unit 84 for moving stepwise the X-Y stage 14 is operated in response to signals from the control unit 82 to move stepwise the X-Y stage 14 in the X direction and/or the Y direction. Simultaneously with such stepping operation, a shutter mechanism (not shown) provided to intercept the light for illuminating the reticle 9 is actuated in response to control signals supplied thereto from the control unit 82 so as to close/open its shutter blade.

Further, the control unit 82 is operationally associated with the input unit 83. Thus, when data concerning exposure conditions (e.g. shot layout) in accordance with the size of the wafer, the type of the semiconductor device being manufactured, etc., is inputted or specified at the input unit 83, it produces corresponding signals which are supplied to the control unit 82. Accordingly, the above-described step-and-repeat exposures are automatically performed under the influence of the control unit 82 and in accordance with the set conditions.

On the other hand, the driving unit 81 for moving, as desired, lens components of the optical integrator 4, is operated in response to signals supplied thereto from the control unit 82 to displace the lens groups of the integrator to their predetermined positions. Such position adjustment is performed automatically in accordance with the data concerning the shot layout which is inputted from the console of the input unit 83. More specifically, the size of the illumination range to be defined on the reticle 9 surface is calculated by means of a computer included in the control unit 82 from the data concerning the shot layout. In accordance with the results of calculation, predetermined one or more lens groups of the optical integrator 4 are automatically driven by the driving mechanism 81 under the influence of the control unit 82.

While the exposure apparatus shown in FIG. 8 is of the reduction projection type, called a "stepper", the concept of the present embodiment is of course be applicable to exposure apparatuses of the contact type or proximity type.

In accordance with the present embodiment, as described, at least two of the minute-lens groups constituting an optical integrator in the illumination optical system are moved to change the refracting power of the integrator to thereby change the effective field of illumination, thus providing an illumination optical system capable of providing stably efficient illumination with a minimum loss of light quantity. Also, adjustment of the refracting power can be controlled automatically in accordance with a designation at the console input. As a result, high-accuracy and high-speed power change is attainable.

In the foregoing, the present invention has been described with reference to embodiments of illumination optical systems which are incorporated into semiconductor device manufacturing exposure apparatuses such as a stepper. However, the invention is not limited thereto, but is applicable also to various devices or apparatuses in which it is desired to change the sectional area of light for irradiating an object in order to assure effective utilization of radiation energy from a light source. Further, with regard to illumination optical systems to be incorporated into semiconductor device manufacturing exposure apparatuses, they may have various modified arrangements. That is, for example, the optical integrator of the structure of the FIG. 1 embodiment may be omitted. On the other hand, plural optical integrators may be used. Further, the field stop may be omitted. Obviously in any case, the present invention is applicable.

Moreover, in the arrangement shown in FIG. 4, an additional optical integrator may be disposed between the light source and the variable-power optical integrator.

The variable-power optical means described as the variable-power condenser lens system or the variable-power optical integrator can be disposed at a desired location in the path of light defined by the illumination optical system. Preferably, it is placed at a position at which the illuminating light has a relatively small diameter. This is because the variable-power optical means can be made more compact.

In accordance with the illumination optical system of the present invention, as has hitherto been described, the sectional area of the illuminating light can be changed in accordance with the size or area of the surface to be illuminated, to change the effective field of illumination. Therefore, the loss of light quantity can be made a minimum, thus assuring efficient utilization of the light quantity. Particularly, where the invention is applied to an illumination optical system in a semiconductor device manufacturing exposure apparatus such as a stepper, the throughput of the apparatus can be improved significantly.

While the invention has been described with reference to the structures disclosed herein, it is not confined to the details set forth and this application is intended to cover such modifications or changes as many come within the purposes of the improvements or the scope of the following claims.

What is claimed is:

1. An illumination optical system usable with a projection optical system for projecting a pattern of a first object upon a second object, for illuminating a surface of the first object, said illumination optical system comprising:
    an optical system effective to direct light from a light source to the surface to be illuminated and also being effective to form an image of the light source on a pupil of the projection optical system; and
    optical means disposed in a path of the light defined by said directing optical system, said optical means having a variable refracting power which is variable in accordance with the size of the surface to be illuminated;
    wherein said image of the light source is formed at a constant position irrespective of the change in the refracting power of said optical means.

2. An illumination optical system according to claim 1, wherein said optical means comprises a plurality of single-lens groups at least one of which is movable in a direction of an optical axis defined by said optical system.

3. An illumination optical system according to claim 1, wherein said optical means comprises a plurality of compound-eye lens groups at least one of which is movable in a direction of an optical axis defined by said optical system.

4. An illumination optical system according to claim 1, wherein said optical system includes multibeam producing means for receiving the light from the light source and producing a number of light beams which are superimposed upon one another on the surface to be illuminated.

5. An illumination optical system according to claim 1, further comprising means for restricting a range of illumination by the light and wherein said optical means is arranged to illuminate said restricting means.

6. An illumination optical system according to claim 1, wherein said light source is formed by a secondary light source, said secondary light source includes a lamp.

7. An illumination optical system usable with a projection optical system for projecting a pattern of a first object upon a second object, for illuminating a surface of the first object, said illumination optical system comprising:
    a multi-beam producing system for receiving light from a light source and for forming a secondary light source which emits a plurality of light beams;
    a condensing optical system for directing the light beams to the surface to be illuminated, said condensing optical system being effective to form an image of said secondary light source on a pupil of the projection optical system and also being effective to superimpose the light beams upon one another on the surface to be illuminated; and
    said condensing optical system including optical means disposed in a path of the light beams from said multi-beam producing system, said optical means having a variable refracting power which is variable in accordance with the size of the surface to be illuminated;
    wherein said image of said secondary light source is formed at a constant position irrespective of the change in the refracting power of said optical means.

8. An illumination optical system according to claim 7, further comprising means for restricting a range of illumination by the light beams and wherein the light beams from said multi-beam producing system path through said restricting means and are directed to the surface to be illuminated.

9. An illumination optical system according to claim 7, wherein said optical means comprises a plurality of lens groups at least one of which is movable in a direction of an optical axis of said illumination optical system.

10. An illumination optical system according to claim 9, wherein said multi-beam producing system comprises a plurality of compound-eye lens groups at least one of which is movable in a direction of an optical axis of said illumination optical system.

11. An illumination optical system usable with a projection optical system for projecting a pattern of a first object upon a second object, for illuminating a surface of the first object, said illumination optical system comprising:
    a multi-beam producing system for receiving light from a light source and for forming a secondary light source which emits a plurality of light beams, said multi-beam producing system having a variable refracting power which is variable in accordance with the size of the surface to be illuminated; and
    a condensing optical system effective to direct the light beams from said multi-beam producing system to the surface to be illuminated, and also being effective to superimpose the light beams upon one another on the surface to be illuminated, said condensing optical system being further effective to bring said secondary light source into a conjugate relationship with a pupil of the projection optical system;

wherein the conjugate relationship is maintained irrespective of the change in the refracting power of said multi-beam producing system.

12. An illumination device comprising:
light source means for supplying light; and
an optical system for receiving the light from said light source means and for directing the light to a surface to be illuminated, said optical system having optical means whose refracting power is variable in accordance with the size of the surface to be illuminated;
wherein said optical system has a rear principal plane which is at a distance from the surface to be illuminated, substantially corresponding to the focal length of said optical system and wherein said distance and said focal length are in a fixed relation irrespective of the change in the refracting power of said optical means.

13. A device according to claim 12, wherein said light source means comprises a light source and an elliptical mirror effective to collect the light from said light source.

14. An illumination device according to claim 12, wherein said optical means comprises a plurality of lens groups which are movable in a direction of an optical axis of said illumination device.

15. An illumination device according to claim 14, wherein each of said lens groups comprises a compound-eye lens.

16. An illumination device comprising:
light source means for supplying light;
means for receiving light from said light source means and for forming, by use of the light, a secondary light source;
condensing optical means for receiving light from said secondary light source and for directing the light to a surface to be illuminated; and
optical means operable to change the range of illumination to be defined by the light from said secondary light source, in accordance with the size of the surface to be illuminated, said optical means changing the range of illumination by changing an angle of emission of light from said secondary light source while retaining a constant angle of incidence of the light upon the surface to be illuminated.

17. A projection exposure system usable with a mask having a circuit pattern and a wafer, said projection exposure system comprising:
supplying means for supplying light;
secondary light source forming means, disposed to receive the light from said supplying means, for forming a secondary light source by use of the received light;
an illumination optical system disposed to receive light from said secondary light source, for illuminating the mask by use of the received light, said illumination optical system having an optical means which has a variable refracting power; and
a projection optical system operable to form an image of the circuit pattern of the mask upon the wafer, said projection optical system having a pupil which is in a conjugate relationship with said secondary light source;
wherein said illumination optical system is adapted to change the refracting power of said optical means in accordance with the range of an area on the mask to be illuminated, while substantially maintaining the conjugate relationship between said secondary light source and the pupil.

18. A projection exposure system according to claim 17, wherein said optical means includes a plurality of lens elements disposed on said optical axis and being movable along said optical axis.

19. A projection exposure system according to claim 17, wherein said illumination optical system includes (i) a field stop disposed on a patch of the light from said optical means and having an aperture of a predetermined shape and (ii) a condensing optical system effective to illuminate the mask by use of the light passed through said field stop, wherein said aperture of said field stop has a size which is changeable and wherein the refracting power of said optical means is changed with the change in the size of said aperture.

20. A projection exposure system according to claim 17, wherein said illumination optical system is arranged to change the refracting power of said optical means while maintaining an interval between a rear principal plane of said illumination optical system and the mask to be substantially equal to a focal length of said illumination optical system.

21. An exposure system usable with a mask having a circuit pattern and a wafer, said exposure system comprising:
supplying means for supplying light;
secondary light source forming means disposed to receive the light from said supplying means, for forming a secondary light source by use of the received light; and
an illumination optical system disposed to receive light from said secondary light source, for illuminating the mask by use of the received light so that the circuit pattern of the mask is transferred onto the wafer, said illumination optical system having an optical means which has a variable refracting power;
wherein said illumination optical system has a focal length and a rear principal plane which is set at such distance from the mask that is substantially equal to said focal length of said illumination optical system and wherein said illumination optical system is adapted to change the refracting power of said optical means in accordance with the range of an area on the mask to be illuminated, while substantially maintaining a fixed relation between said distance and said focal length.

22. An exposure system according to claim 21, wherein said optical means includes a plurality of lens elements disposed on said optical axis and being movable along said optical axis.

23. An exposure system according to claim 21, wherein said illumination optical system includes (i) a field stop disposed on a path of the light from said optical means and having an aperture of a predetermined shape and (ii) a condensing optical system effective to illuminate the mask by use of the light passed through said field stop, wherein said aperture of said field stop has a size which is changeable and wherein the refracting power of said optical means is changed with the change in the size of said aperture.

24. A projection exposure system usable with a mask having a circuit pattern and a wafer, said projection exposure system comprising:
a light source for providing light;
an optical arrangement effective to form a secondary light source of a predetermined size by use of the light from said light source and to illuminate the mask with light from said secondary light source, said optical arrangement having an optical means whose refracting power is variable; and a projection optical system operable to form an image of the circuit pattern of the mask upon the wafer, said projection optical system having a pupil which is in conjugate relationship with said secondary light source;

wherein the refracting power of said optical means is changed in accordance with the range of an area on the mask to be illuminated, such that the range of illumination by the light from said secondary light source is changed while substantially maintaining the conjugate relationship between said pupil and said secondary light source.

25. A projection exposure system according to claim 24, wherein said optical arrangement has a focal length and a rear principal plane which is maintained at a distance substantially equal to said focal length irrespective of the change in the refracting power of said optical means.

26. A projection exposure system according to claim 24, wherein said optical arrangement includes an optical integrator by which said secondary light source is formed.

27. A projection exposure apparatus according to claim 26, wherein said optical means is disposed to receive the light from said secondary light source and wherein said optical means includes at least three movable lens elements, said lens elements being movable in a predetermined interrelation to thereby change the range of illumination while forming the image of said secondary light source substantially at a constant position.

28. A projection exposure system according to claim 26, wherein said optical means is provided by said optical integrator and wherein said optical integrator includes at least three fly's eye lens systems which are movable in a predetermined interrelation to change the range of illumination while forming the image of said secondary light source substantially at a constant position.

29. A projection exposure apparatus, comprising:
a light source;
means for supporting a reticle;
means for supporting a wafer,
arrangement means for forming a secondary light source by use of light from said light source and for illuminating the reticle with light from said secondary light source, said arrangement means including an adjustment optical system having a variable refracting power;
a projection optical system for projecting a pattern of the reticle upon the wafer, said projection optical system having a pupil disposed in a conjugate relationship with said secondary light source; and
an actuator for actuating said adjustment optical system to change an area to be illuminated by said arrangement means, while substantially maintaining the conjugate relationship between said pupil and said secondary light source.

30. An apparatus according to claim 29, wherein said arrangement means includes a masking member having a variable size aperture and being disposed between said adjustment optical system and the reticle, and wherein a change in the refracting power of said adjustment optical system is related to a change in size of said aperture.

31. An apparatus according to claim 30, wherein said adjustment optical system is disposed between said secondary light source and said masking member.

32. An apparatus according to claim 31, wherein said adjustment optical system includes a plurality of lenses displaceable along an optical axis of said adjustment optical system, and wherein said actuator is operable to adjust the relative position of said lenses.

33. An apparatus according to claim 29, wherein said secondary light source is formed with the intervention of said adjustment optical system.

34. An apparatus according to claim 33, wherein said adjustment optical system includes a fly's-eye lens system displaceable along an optical axis of said adjustment optical system and wherein said actuator is operable to adjust the position of said fly's-eye lens system.

* * * * *

UNITED STATES PATENT AND TRADEMARK OFFICE
CERTIFICATE OF CORRECTION

PATENT NO. : 4,851,882
DATED : July 25, 1989
INVENTOR(S) : KAZUHIRO TAKAHASHI, ET AL.

It is certified that error appears in the above-identified patent and that said Letters Patent is hereby corrected as shown below:

COLUMN 1

Line 62, "whidh" should read --which--.

COLUMN 2

Line 55, "device" should read --device,--.

COLUMN 3

Line 39, "effective" should read --effective field--.
    Line 64, "90 degrees" should read --90 degrees,--.

COLUMN 5

Line 6, "light source" should read --light source,--.
    Line 50, "light emitting surface" should read --light-emitting surface--.
    Line 55, "system 5" should read --system 5,--.
    Line 56, "FIG. 2B" should read --FIG. 2B,--.

COLUMN 6

Line 2, "FIG. 2A" should read --FIG. 2A,--.
    Line 34, "position" should read --position,--.

COLUMN 7

Line 28, "23% As" should read --23%. As--.

UNITED STATES PATENT AND TRADEMARK OFFICE
CERTIFICATE OF CORRECTION

PATENT NO. : 4,851,882
DATED : July 25, 1989
INVENTOR(S) : KAZUHIRO TAKAHASHI, ET AL.

It is certified that error appears in the above-identified patent and that said Letters Patent is hereby corrected as shown below:

COLUMN 9

Line 6, "9 which" should read --9, which--.
Line 40, "by" should read --of--.

COLUMN 12

Line 35, "be" should be deleted.

COLUMN 13

Line 28, "many" should read --may--.

COLUMN 14

Line 3, "source, said" should read --source, and said--.
Line 34, "path" should read --pass--.

COLUMN 16

Line 9, "patch" should read --path--.

COLUMN 17

Line 41, "fly's eye lens systems" should read --fly's-eye lens systems--.

UNITED STATES PATENT AND TRADEMARK OFFICE
CERTIFICATE OF CORRECTION

PATENT NO. : 4,851,882

DATED : July 25, 1989

INVENTOR(S) : KAZUHIRO TAKAHASHI, ET AL.

It is certified that error appears in the above-identified patent and that said Letters Patent is hereby corrected as shown below:

COLUMN 18

Line 6, "wafer," should read --wafer;--.

Signed and Sealed this

Twenty-second Day of October, 1991

Attest:

HARRY F. MANBECK, JR.

*Attesting Officer*  *Commissioner of Patents and Trademarks*